(12) United States Patent
Lander

(10) Patent No.: US 9,391,147 B2
(45) Date of Patent: Jul. 12, 2016

(54) SUBSTRATE ARRANGEMENT

(71) Applicant: NXP B.V., Eindhoven (NL)

(72) Inventor: Robert James Pascoe Lander, Leuven (BE)

(73) Assignee: NXP B.V., Eindhoven (NL)

(*) Notice: Subject to any disclaimer, the term of this patent is extended or adjusted under 35 U.S.C. 154(b) by 0 days.

(21) Appl. No.: 14/673,201

(22) Filed: Mar. 30, 2015

(65) Prior Publication Data

US 2015/0295052 A1 Oct. 15, 2015

(30) Foreign Application Priority Data

Apr. 14, 2014 (EP) .................................... 14164634

(51) Int. Cl.
*H01L 29/267* (2006.01)
*H01L 21/02* (2006.01)
*H01L 29/20* (2006.01)
*H01L 21/762* (2006.01)

(52) U.S. Cl.
CPC .......... *H01L 29/267* (2013.01); *H01L 21/0245* (2013.01); *H01L 21/0254* (2013.01); *H01L 21/02381* (2013.01); *H01L 21/02433* (2013.01); *H01L 21/02488* (2013.01); *H01L 21/02516* (2013.01); *H01L 21/02609* (2013.01); *H01L 21/02658* (2013.01); *H01L 29/2003* (2013.01); *H01L 21/7624* (2013.01)

(58) Field of Classification Search
CPC ...................................................... H01L 29/04
See application file for complete search history.

(56) References Cited

U.S. PATENT DOCUMENTS

| 6,497,763 | B2 * | 12/2002 | Kub et al. ........................ 117/94 |
| 6,794,276 | B2 * | 9/2004 | Letertre et al. ................. 438/506 |
| 7,902,045 | B2 * | 3/2011 | Arena et al. .................... 438/459 |
| 8,765,508 | B2 * | 7/2014 | Arena .............................. 438/46 |
| 9,082,692 | B2 * | 7/2015 | Odnoblyudov et al. | |
| 2004/0217352 | A1 | 11/2004 | Forbes | |
| 2007/0004222 | A1 | 1/2007 | Wei | |
| 2009/0173967 | A1 | 7/2009 | Hamaguchi et al. | |
| 2010/0327395 | A1 | 12/2010 | Hamaguchi et al. | |
| 2012/0000415 | A1 * | 1/2012 | D'Evelyn et al. ............... 117/94 |
| 2015/0048301 | A1 * | 2/2015 | Kilbury et al. .................. 257/13 |
| 2015/0090956 | A1 * | 4/2015 | Coones et al. .................. 257/14 |

OTHER PUBLICATIONS

Fujikawa, J. et al. "Silicon on Insulator for Symmetry-Converted Growth", Appl. Phys. Lett. 90, 243107(2007).

Yang, Min et al. "Hybrid-Orientation Technology (HOT): Opportunities and Challenges", IEEE Trans. on Electron Devices, vol. 53, No. 5, pp. 965-978 (May 2006).

Bullard, D. et al. "Grazing Incidence X-ray Studies of Twist-Bonded Si/Si and Si/SiO$_2$ Interfaces", Physica B, vol. 283, No. 1, pp. 103-107(Jun. 2000).

Extended European Search Report for EP Patent Appln. No. 14164634.9 (Jun. 25, 2014).

(Continued)

*Primary Examiner* — Eugene Lee

(57) ABSTRACT

A substrate arrangement comprising a substrate having a surface configured to receive, by epitaxy, an epitaxial layer of semiconducting material, the substrate comprising a laminate having a handle layer and a seed layer, the seed layer having a crystal orientation arranged to receive the epitaxial layer and the handle layer having a crystal orientation different to the seed layer.

14 Claims, 2 Drawing Sheets

(56) References Cited

OTHER PUBLICATIONS

AZO Materials; "World's First Gallium Nitride (GaN)-on-inulator Substrate"; http://www.azom.com/news.aspx?newsID=2616; 1 pg.; Mar. 3, 2005.

Liu, J. et al.; "Investigation of cracks in GaN films grown by combined hydride and metal organic vapor-phase epitaxial method"; http://openi.nlm.nih.gov/detailedresult.php?img=3212216_1556-276X-6-69-6&req=4; 2 pgs; 2011.

"World's First Direct Bonding of SiC-Si and GaN-Si at Room Termperature Achieved by MHI Bonding Machine-Leads Way for New Device Development"; http://www.mhi.co.jp/en/news/story/1007221366.html; 1 pg.; Jul. 22, 2010.

* cited by examiner

SUBSTRATE ARRANGEMENT

CROSS-REFERENCE TO RELATED APPLICATIONS

This application claims the priority under 35 U.S.C. §119 of European patent application no. 14164634.9, filed on Apr. 14, 2014, the contents of which are incorporated by reference herein.

This invention relates to a substrate arrangement for fabrication of an integrated circuit. In particular it relates to a Gallium Nitride on Silicon substrate arrangement. It also relates to a method of wafer fabrication.

Integrated circuits are formed on substrates typically of Silicon. Gallium Nitride is an advantageous semiconducting material for use in the formation of integrated circuit components. It is common for Gallium Nitride to be used in combination with Silicon, which is known as GaN on Silicon. The substrate may comprise a Silicon layer for manual handling of the substrate and a Gallium Nitride layer formed thereon. The Silicon and the Gallium Nitride have different coefficients of thermal expansion and a large lattice mismatch.

According to a first aspect of the invention we provide a substrate arrangement comprising a substrate having a surface configured to receive, by epitaxy, an epitaxial layer of semiconducting material, the substrate comprising a laminate having a handle layer and a seed layer, the seed layer having a crystal orientation arranged to receive the epitaxial layer and the handle layer having a crystal orientation different to the seed layer.

The substrate arrangement is advantageous as the differing crystal orientations in the laminate can be selected such that the risk of fractures through the epitaxial layer spreading to the handle layer are low. The seed layer provides a surface with the appropriate surface orientation for epitaxial formation of the epitaxial layer, while the laminate arrangement provides for a robust substrate for formation of integrated circuit components.

The handle layer and the seed layer may be of a first semiconducting material. The first semiconducting material may comprise Silicon. A robust substrate arrangement may be formed by way of the laminated substrate comprising at least two layers (handle layer and seed layer) of Silicon of different crystal orientation.

The epitaxial layer may be of a semiconducting material different to the first semiconducting material. The epitaxial layer may be of Gallium Nitride. The seed layer may thus have a crystal surface orientation complimentary to epitaxial formation of the epitaxial layer, such as [111] orientation for receipt of [0001] surface oriented GaN.

The handle layer and seed layer may be wafer bonded together. Any wafer bonding process may be used, such as direct bonding or by way of the smart cut process.

A buried oxide layer may extend between the handle layer and the seed layer. For high-voltage applications it may be advantageous to have an insulating layer to isolate an active device from the substrate (and so from the package). An insulating layer may also reduce any capacitive coupling via the substrate which would otherwise degrade performance under high frequency operation.

The seed layer may comprise a [111] surface oriented Silicon layer and the epitaxial layer may comprise a [0001] surface orientated Gallium Nitride layer, epitaxially aligned to the Silicon surface, and the handle layer is of Silicon and, relative to the seed layer, the crystal orientation of the handle layer is twisted (in the x-y plane) by an angle between 40° and 80° and tilted (in the x-z plane) by an angle of between 45° and 65° wherein 0° twist and 0° tilt corresponds to a crystal alignment with the seed layer. The z-direction is defined as perpendicular to the surface. For a [111] surface oriented seed layer, the seed layer has a crystal orientation corresponding to a 45° twist (in the x-y plane) and 54.7° tilt (in the x-z plane) of the [100] diamond unit cell aligned to the x, y, z axes.

The seed layer may comprise a [111] surface oriented Silicon layer and the epitaxial layer comprises a [0001] surface orientated Gallium Nitride layer, epitaxially aligned to the Silicon surface, and the handle layer is of Silicon and, relative to the seed layer, the handle layer is twisted (in the x-y plane) by an angle between 20° and 40° and tilted (in the x-z plane) by an angle of substantially 0° wherein 0° twist and 0° tilt corresponds to a crystal alignment with the seed layer. The z-direction is defined as perpendicular to the surface. For a [111] surface oriented seed layer, the seed layer has a crystal orientation corresponding to a 45° twist (in the x-y plane) and 54.7° tilt (in the x-z plane) of the [100] diamond unit cell aligned to the x, y, z axes.

According to a second aspect of the invention we provide a method of fabrication of a substrate comprising;
bonding a seed layer to a handle layer, the handle layer having a different crystal orientation to the seed layer;
providing a surface on the seed layer adapted to receive, by epitaxy, an epitaxial layer.

The method may include the step of forming a buried oxide layer in the handle layer and wafer bonding the seed layer to the oxide layer.

The method may include the step of, prior to bonding, receiving a handle layer and seed layer of different crystal orientation, the different crystal orientation, with the crystal structure of the seed layer aligned with the handle layer, defined by twisting the handle layer by an angle between 40° and 80° and tilting the handle layer by an angle of between 45° and 65° wherein 0° twist and 0° tilt corresponds to a crystal alignment with the seed layer. The z-direction is defined as perpendicular to the surface. For a [111] surface oriented seed layer, the seed layer has a crystal orientation corresponding to a 45° twist (in the x-y plane) and 54.7° tilt (in the x-z plane) of the [100] diamond unit cell aligned to the x, y, z axes.

The handle layer and seed layer may be of Silicon and the epitaxial layer may comprise Gallium Nitride.

According to a third aspect of the invention we provide an integrated circuit (IC) including the substrate arrangement as defined in the first aspect of the invention or formed by way of the method of the second aspect of the invention.

There now follows, by way of example only. a detailed description of embodiments of the invention with reference to the following figures, in which.

Figure 5:
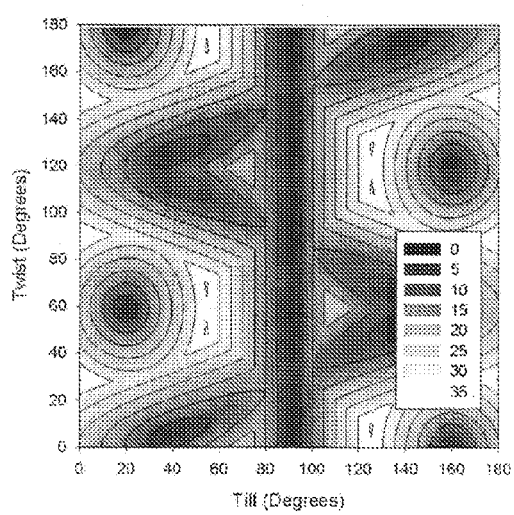
Figure 6:
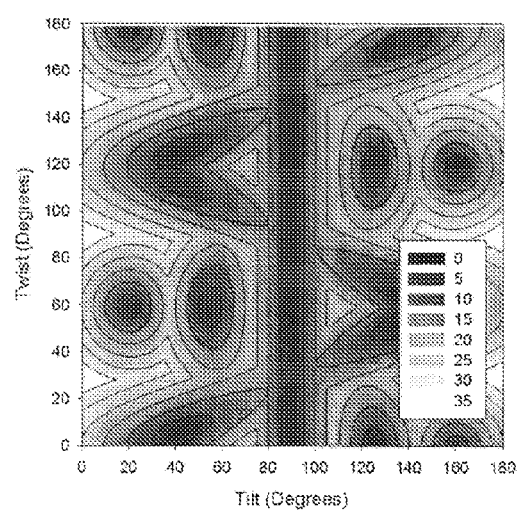

FIG. 5 shows a plot of the angle separating the most closely-aligned cleave planes in a Gallium Nitride layer and Silicon handle layer as a function of the orientation of the handle layer considering a first subset of cleave planes; and FIG. 6 shows a plot of the angle separating the most closely-aligned cleave planes in a Gallium Nitride layer and Silicon handle layer as a function of the orientation of the handle layer considering a second subset of cleave planes.

Figure 1:
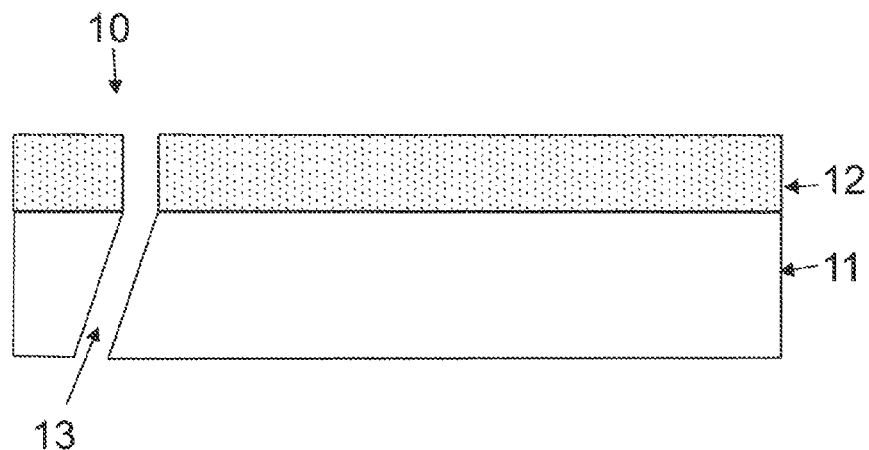
FIG. 1 shows a Gallium Nitride on Silicon substrate arrangement.

FIG. 1 shows a substrate arrangement 10 comprising a substrate or base layer 11 of crystalline Silicon having an epitaxial layer 12 of Gallium Nitride formed thereon. The Silicon base layer 11 is [111] surface oriented and the Gallium Nitride is epitaxially formed on the surface [0001] oriented. It will be appreciated that FIG. 1 comprises a schematic diagram and the base layer 11 may have a thickness of several hundred microns and the epitaxial layer 12 may have a thickness of 1 to 10 microns, for example.

FIG. 1 shows a break 13 in the arrangement 10 comprising a [1010] oriented fracture in the Gallium Nitride layer that has propagated into the substrate 11 along an [1̄1̄1] oriented fracture. The [1010] plane in the Gallium Nitride layer is misaligned with the [1̄1̄1] plane of the substrate by 19.5°. Propagation of fractures between the Gallium Nitride layer and the base layer may lead to wafer breakage and wastage in the fabrication process.

Figure 2:
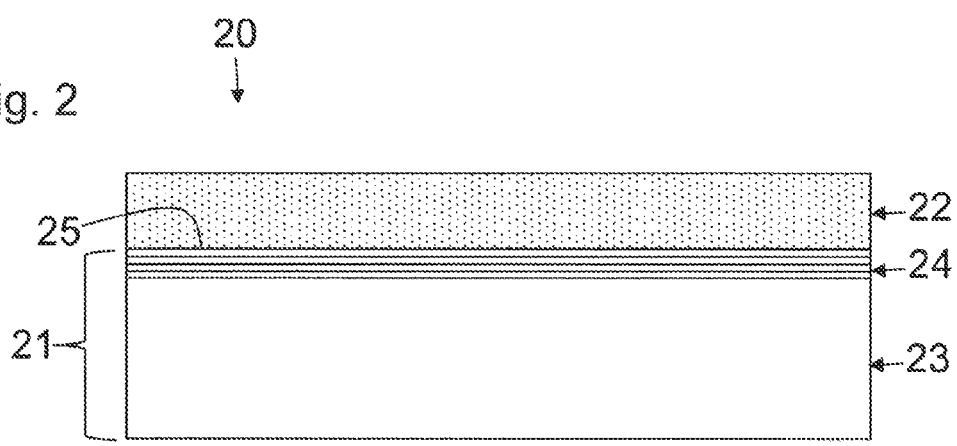
FIG. 2 shows a first example of a Gallium Nitride on Silicon substrate arrangement that includes a laminated handle layer and a seed layer.

FIG. 2 shows a substrate arrangement 20 comprising a substrate 21 of a first semiconducting material, which in this example comprises Silicon. An epitaxial layer 22 of a second semiconducting material different to the first semiconducting material, which in this example comprises Gallium Nitride, is formed by epitaxy on the substrate 21.

The substrate 21 comprises a laminate having a plurality of distinct layers. The substrate 21 comprises a handle layer 23 and a seed layer 24. The seed layer 24 includes a surface 25 configured to receive the epitaxial layer 22. Thus, the seed layer 24 has a crystal structure orientation that is complimentary to the epitaxial formation of the epitaxial layer 22. In this example, the seed layer 24 is [111] surface oriented such that it may receive a [0001] surface oriented tensile Gallium Nitride (wurtzite crystal type) epitaxial layer 22.

The handle layer 23 provides the mechanical strength of the substrate and may provide a surface/body for handling the arrangement. The handle layer may have a thickness of between 100 and 1500 µm. The seed layer 22 may be thinner than the handle layer 23. The seed layer provides an epitaxial surface complimentary to the crystal structure of the epitaxial layer that is to be formed thereon. The seed layer 24 may have a thickness of between 20 nm and 10 µm, for example.

The handle layer 23 has a crystal structure orientation that is different to the crystal structure orientation of the seed layer 24. The handle layer 23 and the seed layer 24 are wafer bonded together. By misaligning the crystal structures of the layers in the laminated substrate 21, a reduction in the risk of wafer breakage can be achieved. In particular, the angle between the fractures that may form in the epitaxial layer can be decoupled (i.e. increased beyond a threshold) from fractures that may form in the handle layer 23 while the seed layer 24 provides a suitable surface orientation for epitaxial growth.

Figure 3:
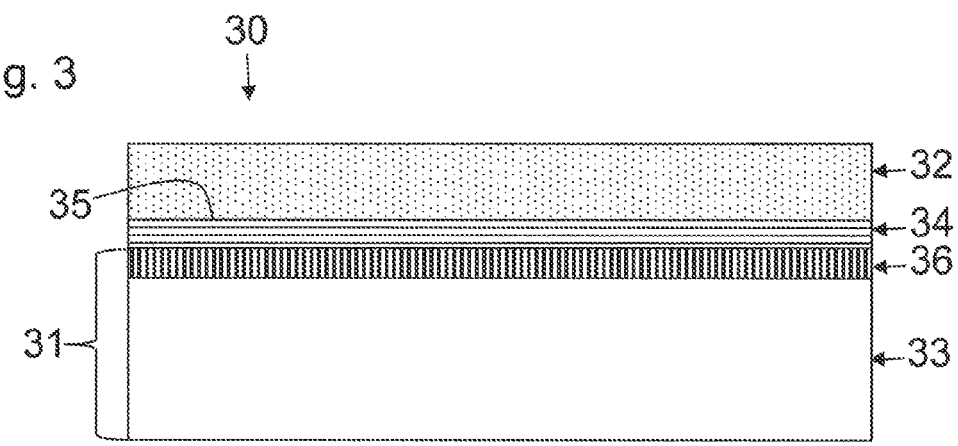
FIG. 3 shows a second example of a Gallium Nitride on Silicon substrate arrangement that includes a laminated handle layer and a seed layer.

FIG. 3 shows a second example of a substrate arrangement 30 and is substantially similar to the first example of FIG. 2. Thus, corresponding reference numerals have been used. The substrate comprises a handle layer 33 having a buried oxide layer 36 formed therein. The seed layer 34 is wafer bonded to the oxide layer of Silicon Oxide ($SiO_2$). It will be appreciated that any process may be used to wafer bond the seed layer 34 to the handle layer 33, the seed and handle layers having differing crystal orientations. As in the previous example, the seed layer comprises a surface 35 for receiving the epitaxial layer 32, the seed layer being [111] surface oriented such that it may receive a [0001] surface oriented Gallium Nitride (wurtzite crystal type) epitaxial layer 32.

The misaligned crystal orientations between the handle layer 23, 33 and the seed layer 24, 34 and thus the epitaxial layer 22, 32 given that epitaxial formation occurs between particularly aligned crystal structures of the different materials of the seed layer and epitaxial layers, may improve the robustness of the overall arrangement 20, 30. The orientation of the various cleave planes in the epitaxial layer 22, 32 relative to the cleave planes in the handle substrate 23, 33 may be selected to increase the angular separation between them. This may decrease the risk of fractures propagating through the mis-oriented layers.

Figure 4:
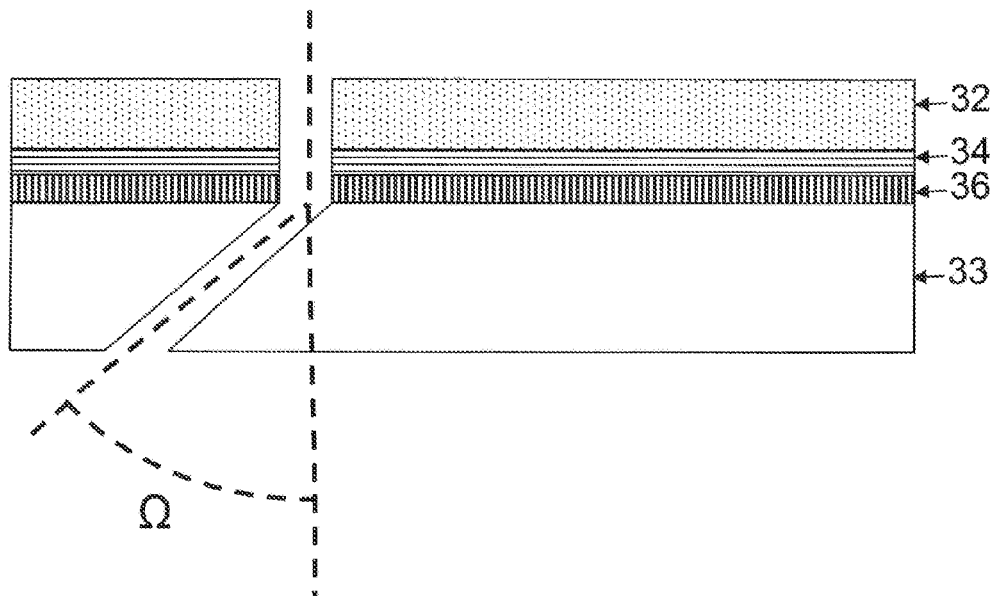
FIG. 4 shows the angle between a cleave plane in the Gallium Nitride and a cleave plane in the handle layer.

FIG. 4 shows a fracture through the arrangement of FIG. 3. The angle Ω between the fracture plane through the epitaxial layer 32 and the nearest fracture plane through the handle layer 33 may be approximately 35.7° compared to 19.5° in FIG. 1. The fracture orientation in the epitaxial layer comprises [1010], [1̄100] or [01̄10] and the fracture shown in the handle layer has an orientation of [111], [1̄1̄1], [1̄11̄] or [11̄1̄].

The angle separating the most closely-aligned cleave planes in a Gallium Nitride epitaxial layer and a substrate (with a misaligned handle layer and seed layer) of silicon is plotted in FIG. 5 as a function of the orientation of the substrate. The plot 50 takes account of three [1010] Gallium Nitride cleavage planes and four [111] Silicon handle layer cleavage planes. In particular, FIG. 5 shows the minimum angle between any of the three equivalent [1010] GaN cleavage planes and any of the four equivalent [111] Si cleavage planes as a function of the handle layers twist and tilt. Twist (performed first) is in an x-y plane and tilt (performed second) is in a y-z plane where 0° twist and 0° tilt corresponds to a handle layer crystal structure in alignment with the [111] surface-oriented seed layer.

The crystal structure orientation yielding the maximum angle separating the most closely-aligned cleavage planes corresponds to a tilt of 54.2° and twist of 49.7°. At this point the minimum angle separating cleavage planes is 35.7°. It will be appreciated that the tilt may be between 45 and 65° or more preferably between 50 and 60° and the twist may be between 40 and 80° or more preferably between 50 and 70°.

FIG. 6 shows a similar plot 60 to FIG. 5. However, we now consider, in addition to the four [111] Silicon handle layer cleavage planes, three equivalent [110] Silicon handle layer cleavage planes. Cleavage along the three [110] planes may be less preferable than along the four [111] planes. The crystal structure orientation yielding the maximum angle separating the most closely-aligned cleavage planes corresponds to a tilt of 0° and twist of 29.8°. It will be appreciated that the tilt may be between 0 and 20° or more preferably between 0 and 10° and the twist may be between 20 and 40° or more preferably between 25 and 35°.

Thus, taking a silicon unit cell with the (fixed) x-, y- and z-axes aligned to the principle axes of the unit cell, the crystal orientation of the seed layer is defined by a 45° twist and a 54.7° tilt transform of the unit cell. This presents a [111] surface oriented seed layer. The orientation of the handle layer is defined by a further twist and tilt as described above of this seed layer orientation with twist in the x-y plane followed by t it in the x-z plane.

It will be appreciated that while the above embodiments discuss the formation of a Gallium Nitride epitaxial layer on a wafer bonded laminate of Silicon with layers of misaligned crystal structures, the arrangement may include epitaxial layers of other materials. For example, the epitaxial layer may comprise Indium gallium nitride (InGaN) or Aluminium gallium nitride (AlGaN) or any other material. The surface orientation of the seed layer can be selected to be complimentary to the epitaxial layer chosen, while the orientation of the handle layer can be selected to provide low risk of fracture propagation through the entire substrate arrangement. It will be appreciated that the handle layer and seed layer may be of a material other than Silicon.

The invention claimed is:

1. A substrate arrangement comprising a substrate having a surface configured to receive, by epitaxy, an epitaxial layer of semiconducting material, the substrate comprising a laminate having a handle layer and a seed layer, the seed layer having a crystal orientation arranged to receive the epitaxial layer and the handle layer having a crystal orientation different to the seed layer;

in which the seed layer comprises a [111] surface oriented Silicon layer and the epitaxial layer comprises a [0001] surface orientated Gallium Nitride layer and the handle layer is of Silicon and, relative to the seed layer, the handle layer is twisted by an angle between 40° and 80° and tilted by an angle of between 45° and 65° wherein 0° twist and 0° tilt corresponds to a crystal alignment with the seed layer, wherein the z-direction is defined as perpendicular to the surface and, for the [111] surface oriented seed layer, the seed layer has a crystal orientation corresponding to a 45° twist in the x-y plane and 54.7° tilt in the x-z plane of a [100] diamond unit cell aligned to the x, y, z axes.

2. A substrate arrangement according to claim 1, in which the handle layer and the seed layer are of a first semiconducting material.

3. A substrate arrangement according to claim 2, in which the first semiconducting material comprises Silicon.

4. A substrate arrangement according to claim 1, in which the epitaxial layer is of a semiconducting material different to the first semiconducting material.

5. A substrate arrangement according to claim 4, in which the epitaxial layer is of Gallium Nitride.

6. A substrate arrangement according to claim 1, in which the handle layer and seed layer are wafer bonded together.

7. A substrate arrangement according to claim 1, in which a buried oxide layer extends between the handle layer and the seed layer.

8. A substrate arrangement comprising a substrate having a surface configured to receive, by epitaxy, an epitaxial layer of semiconducting material, the substrate comprising a laminate having a handle layer and a seed layer, the seed layer having a crystal orientation arranged to receive the epitaxial layer and the handle layer having a crystal orientation different to the seed layer;

in which the seed layer comprises a [111] surface oriented Silicon layer and the epitaxial layer comprises a [0001] surface orientated Gallium Nitride layer and the handle layer is of Silicon and, relative to the seed layer, the handle layer is twisted by an angle between 20° and 40° and tilted by an angle of substantially 0° wherein 0° twist and 0° tilt corresponds to a crystal alignment with the seed layer, wherein the z-direction is defined as perpendicular to the surface and, for the [111] surface oriented seed layer, the seed layer has a crystal orientation corresponding to a 45° twist in the x-y plane and 54.7° tilt in the x-z plane of a [100] diamond unit cell aligned to the x, y, z axes.

9. A substrate arrangement according to claim 8, in which the handle layer and the seed layer are of a first semiconducting material.

10. A substrate arrangement according to claim 9, in which the first semiconducting material comprises Silicon.

11. A substrate arrangement according to claim 8, in which the epitaxial layer is of a semiconducting material different to the first semiconducting material.

12. A substrate arrangement according to claim 11, in which the epitaxial layer is of Gallium Nitride.

13. A substrate arrangement according to claim 8, in which the handle layer and seed layer are wafer bonded together.

14. A substrate arrangement according to claim 8, in which a buried oxide layer extends between the handle layer and the seed layer.

* * * * *